United States Patent
Lee

(10) Patent No.: US 7,376,035 B2
(45) Date of Patent: May 20, 2008

(54) SEMICONDUCTOR MEMORY DEVICE FOR PERFORMING REFRESH OPERATION AND REFRESH METHOD THEREOF

(75) Inventor: Jong Won Lee, Gyeonggi-do (KR)

(73) Assignee: Hynix Semiconductor Inc., Icheon-shi (KR)

( * ) Notice: Subject to any disclaimer, the term of this patent is extended or adjusted under 35 U.S.C. 154(b) by 71 days.

(21) Appl. No.: 10/879,181

(22) Filed: Jun. 30, 2004

(65) Prior Publication Data

US 2005/0226073 A1   Oct. 13, 2005

(30) Foreign Application Priority Data

Apr. 12, 2004  (KR) .................. 10-2004-0024966

(51) Int. Cl.
  *G11C 7/00*  (2006.01)
  *G11C 8/00*  (2006.01)
(52) U.S. Cl. ................. 365/222; 365/230.06; 365/203; 365/205; 365/194
(58) Field of Classification Search ................ 365/222, 365/194, 203, 205, 207, 208, 230.06
See application file for complete search history.

(56) References Cited

U.S. PATENT DOCUMENTS

| | | | | |
|---|---|---|---|---|
| 5,623,451 A | * | 4/1997 | Kawagoe ................ | 365/222 |
| 6,005,818 A | * | 12/1999 | Ferrant ................ | 365/222 |
| 6,449,204 B1 | * | 9/2002 | Arimoto et al. ........... | 365/222 |
| 6,545,924 B2 | * | 4/2003 | Fujieda et al. ........... | 365/222 |
| 6,882,586 B2 | * | 4/2005 | Sato et al. .............. | 365/222 |
| 6,885,608 B2 | * | 4/2005 | Nagano ................ | 365/222 |
| 6,922,371 B2 | * | 7/2005 | Takahashi et al. .......... | 365/222 |
| 6,925,021 B2 | * | 8/2005 | Cowles et al. ............. | 365/222 |
| 6,925,023 B2 | * | 8/2005 | Mizugaki et al. .......... | 365/222 |
| 6,937,503 B2 | * | 8/2005 | Sohn .................. | 365/222 |
| 6,950,363 B2 | * | 9/2005 | Matsubara ............... | 365/222 |

FOREIGN PATENT DOCUMENTS

| | | |
|---|---|---|
| JP | 2000-311498 | 11/2000 |
| JP | 2004-062925 | 2/2004 |
| KR | 1020020058505 A | 7/2002 |

* cited by examiner

*Primary Examiner*—Trong Phan
(74) *Attorney, Agent, or Firm*—Townsend and Townsend and Crew LLP

(57) ABSTRACT

A semiconductor memory device for performing a refresh operation comprises a memory cell array, a driving control unit, a word line driving unit, a sense amplifier driving unit and a sense amplifier. The memory cell array comprising a plurality of cells stores data. The driving control unit receives a row address and a plurality of command signals to output a word line control signal and a sense amplifier control signal, and sets an enable period of the sense amplifier control signal in response to a refresh signal. The word line driving unit receives the word line control signal to drive a word line. The sense amplifier driving unit receives the sense amplifier control signal to drive a sense amplifier. The sense amplifier senses and amplifies data of the bit line in response to an output signal from the sense amplifier driving unit. In the semiconductor memory device, sensing time is increased at a self-refresh mode, thereby reducing self-refresh current and improving refresh characteristics.

4 Claims, 5 Drawing Sheets

SEMICONDUCTOR MEMORY DEVICE FOR PERFORMING REFRESH OPERATION AND REFRESH METHOD THEREOF

BACKGROUND OF THE INVENTION

1. Field of the Invention

The present invention generally relates to a semiconductor memory device for performing a refresh operation and a refresh method thereof, and more specifically, to a technology of reducing self-refresh current and improving refresh characteristics by increasing sensing time only at a self-refresh mode.

2. Background of the Invention

In general, a semiconductor memory device to store data in a plurality of memory cells or to read the stored data comprises a plurality of bit lines, a plurality of word lines, circuits for selecting the bit lines or word lines and a plurality of sense amplifiers.

A DRAM of the memory devices comprises a selective transistor and a storage capacitor to improve integration density. However, since charges stored in the storage capacitor are leaked through the selective transistor in the DRAM, a periodical refresh operation is required to recharge the leakaged charges. This refresh operation is divided into an auto-refresh mode and a self-refresh mode.

FIG. 1 is a graph illustrating a row active operation of a conventional semiconductor memory device.

When data of the cell is at a high level, charges stored in the cell are shared in a bit line BL1 if a word line WL is activated. Thereafter, the bit line BL1 rises higher than a bit line bar /BL1 by a delta voltage dV1, the bit line BL1 is amplified to a core voltage VCORE level by a sense amplifier enable signal SAEN, and the bit line bar /BL1 is amplified to a ground voltage VSS level.

On the other hand, when data of the cell is at a low level, charges stored in the cell are shared in a bit line BL0 if a word line WL is activated. Thereafter, a bit line bar /BL0 falls lower than the bit line BL0 by a delta voltage dV0, the bit line bar /BL0 is amplified to the ground voltage VSS level by a sense amplifier, and the bit line BL0 is amplified to the core voltage VCORE level. Here, the delta voltages dV0 and dV1 are required to be higher than an off-set voltage of the sense amplifier.

However, when the sufficient delta voltages dV0 and dV1 are not secured in the operation of the semiconductor memory device, a sense amplifier enable signal is enabled in a state where the delta voltages dV0 and dV1 are lower than the off-set voltage of the sense amplifier. As a result, the sense amplifier cannot perform the precise data amplification operation.

In order to secure the sufficient delta voltages dV0 and dV1, sensing time to when the sense amplifier is driven from when the word line WL is enabled is required to be increased.

However, the sensing time is designed in consideration of the operating margin and the operating speed when the sufficient dV1 is obtained from the cell data. As a result, if the sensing time is increased both at the normal mode and at the refresh mode, the operating speed of the semiconductor memory device is reduced and power consumption is increased.

SUMMARY OF THE INVENTION

It is an object of the present invention to increase sensing time only at a refresh mode to secure a sufficient delta voltage dV, thereby improving refresh characteristics, increasing a refresh period and reducing power consumption.

In an embodiment, a semiconductor memory device for performing a refresh operation comprises a memory cell array, a driving control unit, a word line driving unit, a sense amplifier driving unit and a sense amplifier. The memory cell array comprising a plurality of cells stores data. The driving control unit receives a row address and a plurality of command signals to output a word line control signal and a sense amplifier control signal, and sets an enable period of the sense amplifier control signal in response to a refresh signal. The word line driving unit receives the word line control signal to drive a word line. The sense amplifier driving unit receives the sense amplifier control signal to drive a sense amplifier. The sense amplifier senses and amplifies data of the bit line in response to an output signal from the sense amplifier driving unit.

In an embodiment, a refresh method of a semiconductor memory device for performing a refresh operation comprises the steps of: selecting a word line in response to a row address and a command signal; transmitting data of a cell connected to the selected word line to a bit line; setting sensing time in response to a refresh signal to amplify data transmitted to the bit line; and restoring the amplified data of the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
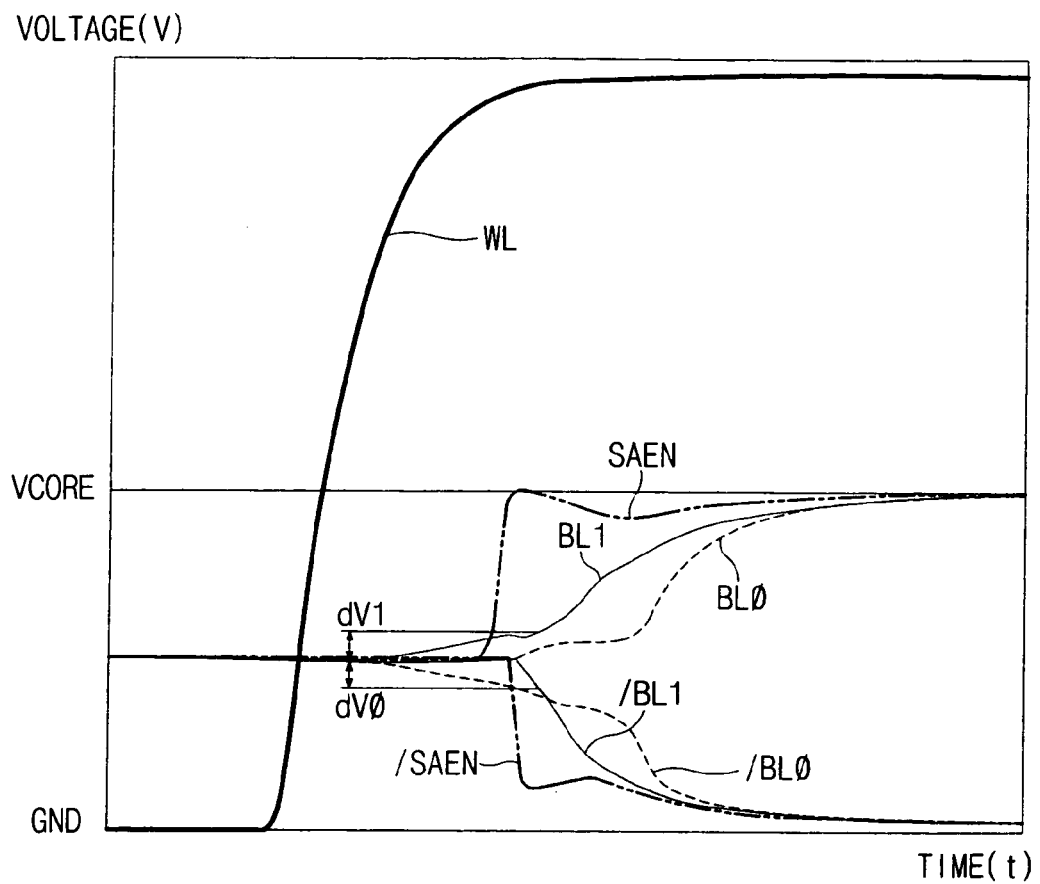
FIG. 1 is a graph illustrating a row active operation of a conventional semiconductor memory device.
Figure 2:
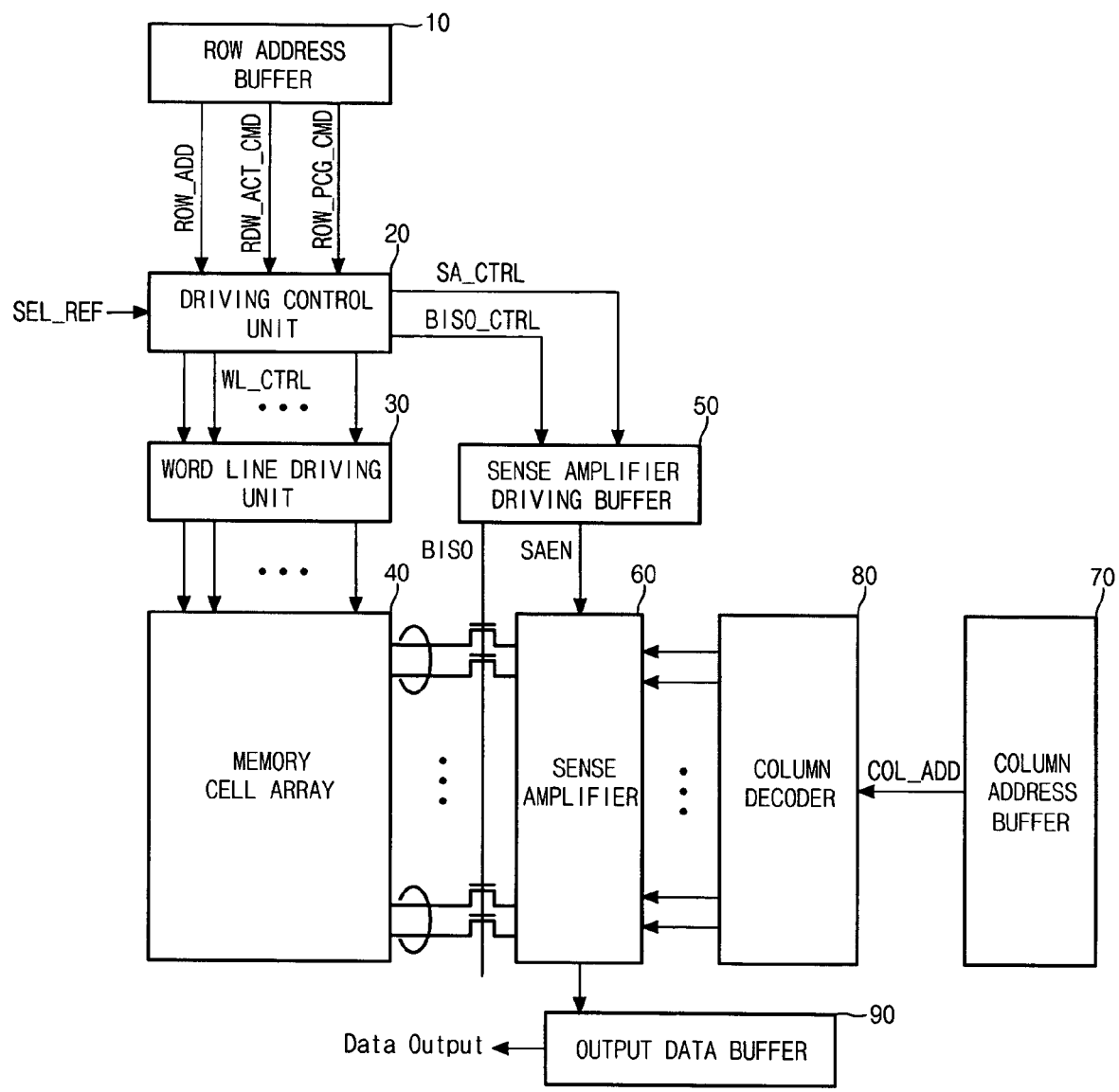
FIG. 2 is a diagram illustrating a semiconductor memory device according to an embodiment of the present invention.

FIG. 2 is a diagram illustrating a semiconductor memory device according to an embodiment of the present invention.

In an embodiment, the semiconductor memory device comprises a row address buffer 10, a driving control unit 20, a word line driving unit 30, a memory cell array 40, a bit line separating signal (hereinafter, referred to as "BISO") control and sense amplifier driving unit 50, a sense amplifier 60, a column address buffer 70, a column decoder 80 and an output data buffer 90.

The row address buffer 10 buffers row address signals, and outputs a row active command signal ROW_ACT_CMD and a row precharge command signal ROW_PCG_CMD.

The driving control unit 20 receives a row address signal ROW_ADD, the row active command signal ROW_ACT_CMD and the row precharge command signal ROW_PCG_CMD, and outputs control signals such as a BISO control signal BISO_CTRL for controlling when the bit line separating signal BISO is enabled or disabled, a word line control signal WL_CTRL for controlling when a word line is enabled or disabled, and a sense amplifier control signal SA_CTRL for controlling when a sense amplifier is enabled or disabled.

Here, the driving control unit 20 distinguishes a normal mode and a refresh mode to control whether the sense amplifier control signal SA_CTRL is outputted, thereby controlling sensing time of the sense amplifier 60. That is, the driving control unit 20 delays the sense amplifier control signal SA_CTRL at the refresh mode to delay the driving time of the sense amplifier 60, thereby increasing the sensing time.

The word line driving unit 30 receives each control signal from the driving control unit 20, and selectively drives one of the word lines of the memory cell array 40.

The memory cell array 40 comprising a plurality of cells including a capacitor (not shown) and a transistor (not shown) stores data.

The BISO control and sense amplifier driving unit 50 receives the BISO control signal BISO_CTRL and the sense amplifier control signal SA_CTRL from the driving control unit 20, and controls a bit line separating transistor and the sense amplifier 60.

The sense amplifier 60 amplifies data depending on an output signal SAEN from the sense amplifier driving unit 50, if the data of the cells and the memory array 40 connected to the selected word line by the word line driving unit 30 are transmitted to the bit line, and outputs the data of the selected bit line, and outputs the data of the selected bit line from the column decoder 70 to the output data buffer 90.

The column address buffer 70 buffers a column address, and the column decoder 80 decodes the column address from the column address buffer 70. As a result, the bit line is selected by the decoding result.

The output data buffer 90 externally outputs data amplified in the sense amplifier 60.

Figure 3:
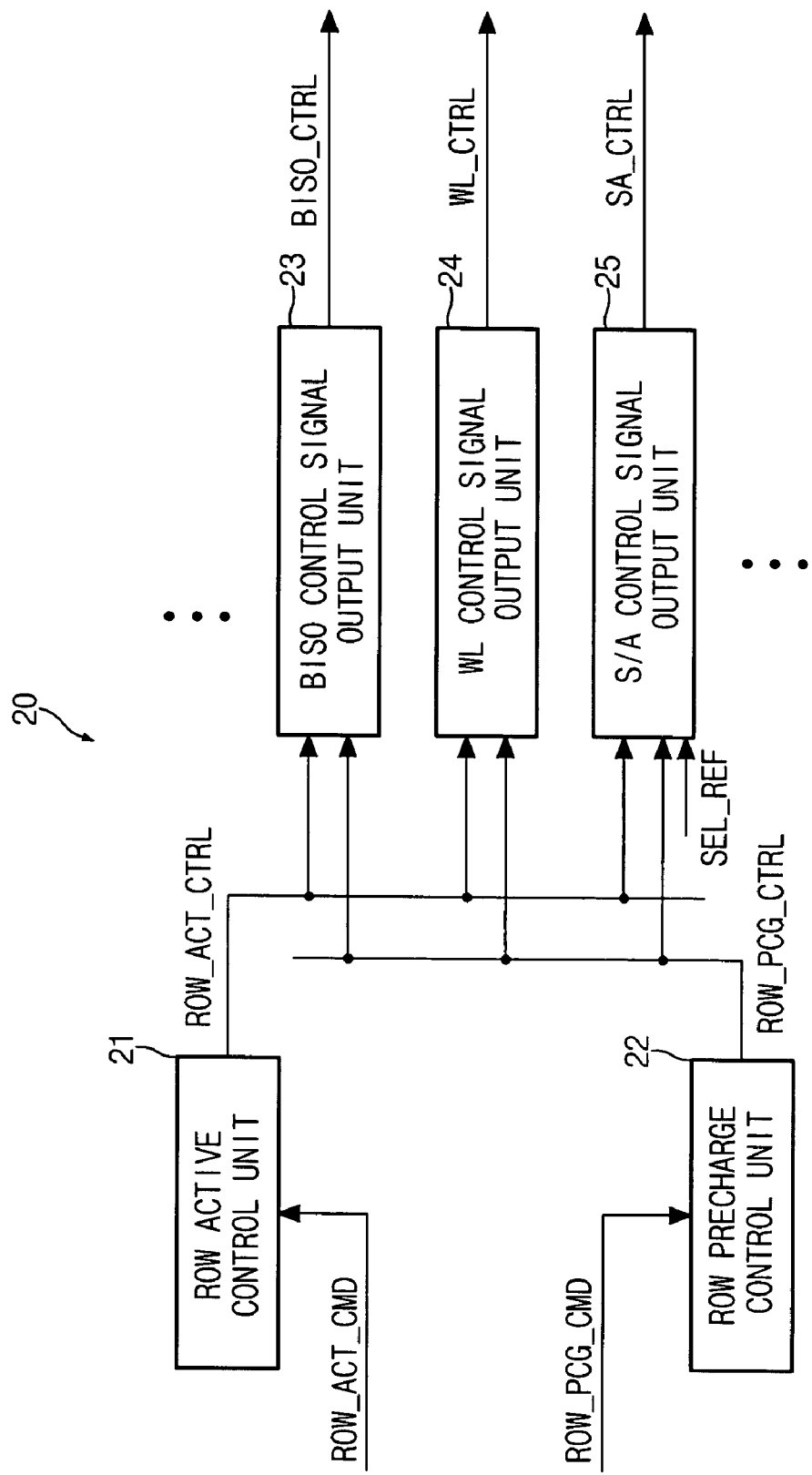
FIG. 3 is a diagram illustrating a driving control unit of FIG. 2.

FIG. 3 is a diagram illustrating the driving control unit 20 of FIG. 2.

The driving control unit 20 comprises a row active control unit 21, a row precharge control unit 22, a bit line separating control signal output unit 23, a word line control signal output unit 24 and a sense amplifier control signal output unit 25.

The row active control unit 21 receives the row active command signal ROW_ACT_CMD to output a rwo active control signal ROW_ACT_CTRL. The row precharge control unit 22 receives the row precharge command signal ROW_PCG_CMD to output a row precharge control signal ROW_PCG_CTRL.

The bit line separating control signal output unit 23, the word line control signal output unit 24 and the sense amplifier control signal output unit 25 receive the row active control signal ROW_ACT_CTRL and the row precharge control signal ROW_PCG_CTRL, and output a BISO control signal BIOS_CTRL, a word line control signal WL_CTRL and a sense amplifier control signal SA_CTRL, respectively.

Figure 4:
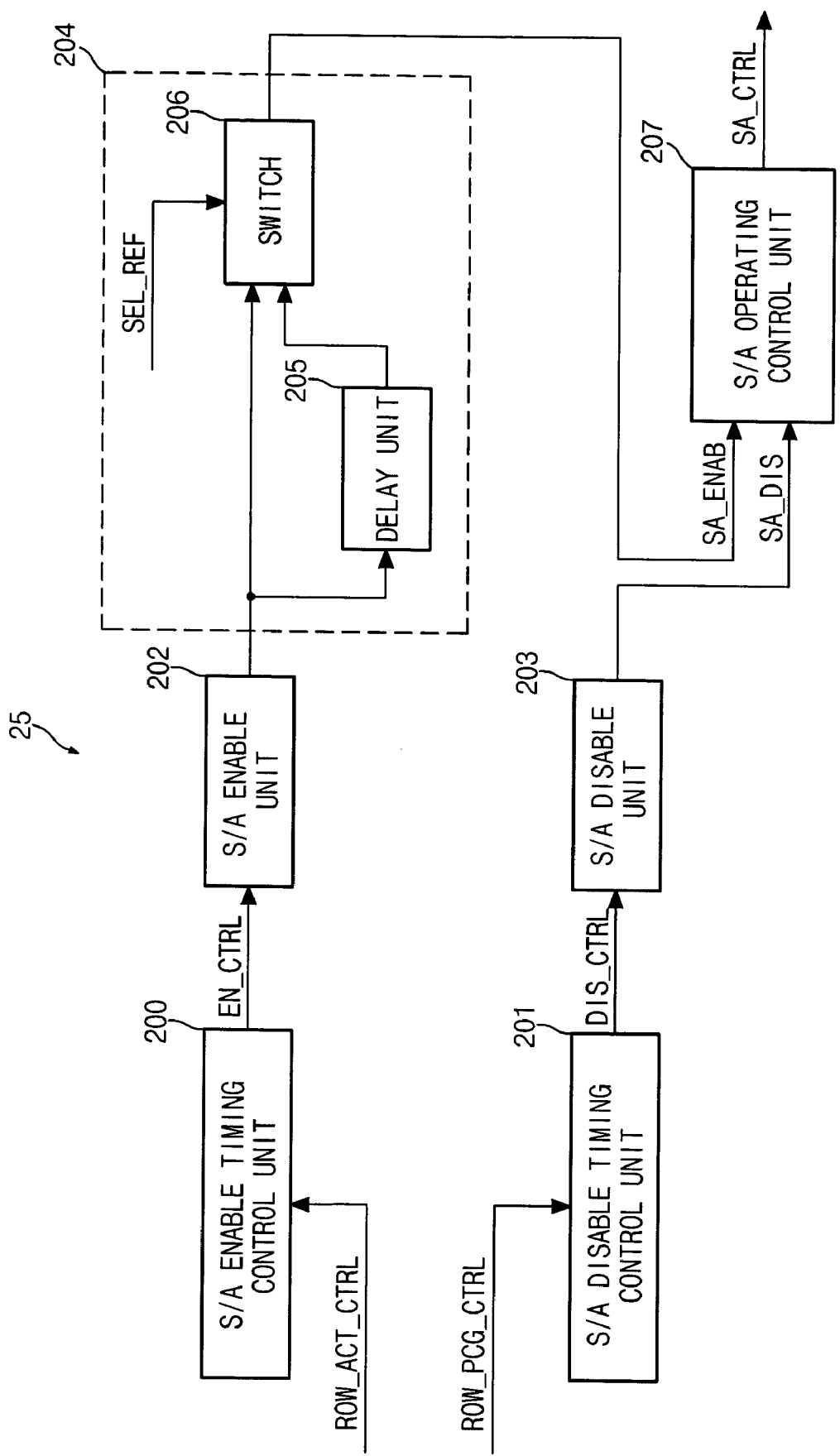
FIG. 4 is a diagram of a sense amplifier control unit of FIG. 3.

FIG. 4 is a diagram of the sense amplifier control unit 25 of FIG. 3.

The sense amplifier control signal output unit 25 comprises a sense amplifier enable timing control unit 200, a sense amplifier disable timing control unit 201, a sense amplifier enable unit 202, a sense amplifier disable unit 203, a sensing time control unit 204 and a sense amplifier operation control unit 207.

The sense amplifier enable timing control unit 200 receives the row active control signal ROW_ACT_CTRL, and outputs an enable control signal EN_CTRL for controlling when the sense amplifier is enabled.

The sense amplifier disable timing control unit 201 receives the row precharge control signal ROW_PCG_C-TRL, and outputs a disable control signal DIS_CTRL for controlling when the sense amplifier is disabled.

The sense amplifier enable unit 202 receives the enable control signal EN_CTRL, and outputs the signal EN_CTRL to the sensing time control unit 204. The sense amplifier disable unit 203 receives the disable control signal DIS_C-TRL, and outputs a sense amplifier disable control signal SA_DIS.

The sensing time control unit 204 comprising a delay unit 205 and a switch 206 controls whether a sense amplifier enable control signal SA_ENAB is outputted.

The switch 206, which is controlled by a self-refresh signal SEL_REF, outputs an output signal from the sense amplifier enable unit 202 as the sense amplifier enable control signal SA_ENAB at the normal mode, and delays the output signal from the sense amplifier enable unit 202 through the delay unit 205 to output the delayed signal as the sense amplifier enable control signal SA_ENAB at a self-refresh mode.

Accordingly, in the semiconductor memory device comprising the sensing time control unit 204 according to an embodiment of the present invention, the sensing time is increased because the delay unit 205 delays the output signal from the sense amplifier enable unit 202 to delay the sense amplifier enable control signal SA_ENAB only at the refresh mode.

Figure 5:
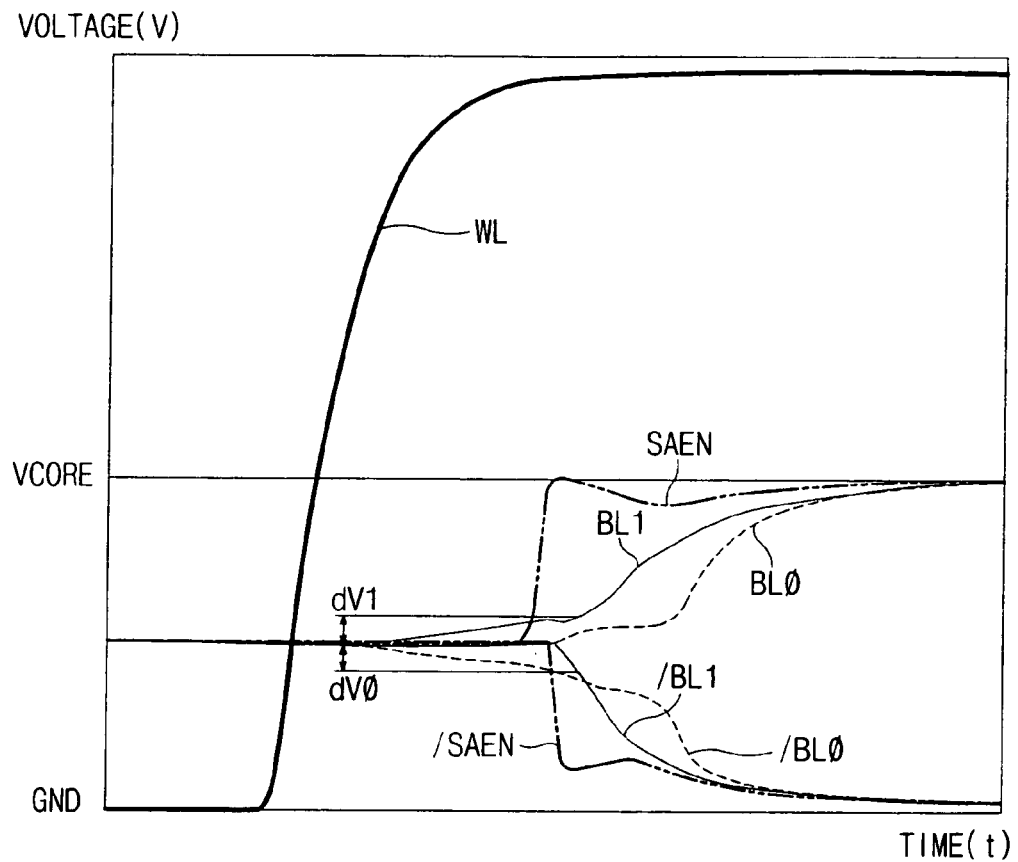
FIG. 5 is a graph illustrating a row active operation at a refresh mode of a semiconductor memory device according to an embodiment of the present invention.

FIG. 5 is a graph illustrating a row active operation at a refresh mode of a semiconductor memory device according to an embodiment of the present invention.

For the row active operation, the driving control unit 20 receives the row address signal ROW_ADD, the row active command signal ROW_ACT_CMD and the row precharge command signal ROW_PCG_CMD from the row address buffer 10.

The driving control unit 20 outputs the bit line separating control signal BISO_CTRL, the word line control signal WL_CTRL and the sense amplifier control signal SA_CTRL in response to the row active command signal ROW_ACT_CMD and the row precharge command signal ROW_PCG_CMD.

Here, the driving control unit 20 distinguishes the self-refresh mode and the normal mode in response to the self-refresh signal SEL_REF, and delays the sense amplifier control signal SA_CTRL at the self-refresh mode.

The word line driving unit 30 receives the word line control signal WL_CTRL to select a word line, and the memory cell array 40 transmits data of the cell connected to the selected word line to the bit line.

Otherwise, the BISO control and sense amplifier driving unit 50 receives the BISO control signal BISO_CTRL and the sense amplifier control signal SA_CTRL and outputs the signal BISO and sense amplifier enable signal SAEN to drive the bit line separating transistor and the sense amplifier 60, respectively. As a result, after the data transmitted to the bit line are amplified, data of the selected bit line by the column decoder 70 are outputted to the output data buffer 90. Here, since the sense amplifier control signal SA_CTRL is delayed at the refresh mode, the sense amplifier 60 is also delayed.

As discussed earlier, in a semiconductor memory device according to an embodiment of the present invention, a sufficient delta voltage dV is secured by increasing sensing time only at a refresh mode, thereby improving refresh characteristics, reducing power consumption and improving operating speed of the semiconductor memory device.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor memory device for performing a refresh operation, comprising:
    a memory cell array comprising a plurality of cells for storing data;
    a driving control unit for receiving a row address and a plurality of command signals to output a work line control signal and a sense amplifier control signal, and for setting a longer sensing time enable period of the sense amplifier control signal at a refresh mode than at a normal mode in response to a refresh signal so as to secure a sufficient delta voltage by increasing sensing time only at a refresh mode;
    a word line driving unit for receiving the word line control signal to drive a word line;
    a sense amplifier driving unit for receiving the sense amplifier control signal to drive a sense amplifier; and
    a sense amplifier for sensing and amplifying date of the bit line in response to an output signal from the sense amplifier driving unit,
    wherein the driving control unit comprises:
        a row active control unit for receiving a row active command signal of the plurality of command signals to output a row active control signal;
        a row precharge control unit for receiving a row precharge command signal of the plurality of command signals to output a row precharge control signal;
        a bit line separating control signal output unit for receiving the row active control signal and the row precharge control signal to output a bit line separating control signal for controlling when a bit line separating signal is enabled;
        a word line control signal output unit for receiving the row active control signal and the row precharge control signal to output a word line control signal for controlling when a word line is enabled; and
        a sense amplifier control signal output unit for receiving the row active contra signal, the row precharge control signal and the refresh signal to output the sense amplifier control signal for controlling when a sense amplifier is enabled,
    wherein the sense amplifier control signal output unit comprises:
        a sense amplifier enable timing control unit for receiving the row active control signal to control when the sense amplifier is enabled;
        a sense amplifier enable unit for outputting a sense amplifier enable control signal it response to an output signal from the sense amplifier enable timing control unit;
        a sensing time control unit for delaying the sense amplifier enable control signal at refresh mode;
        a sense amplifier disable timing control unit for receiving the row precharge signal to control when a sense amplifier is disabled;
        a sense amplifier disable unit for outputting a sense amplifier disable control signal it response to an output signal from the sense amplifier disable timing control unit; and
        a sense amplifier operation control unit for receiving the sense amplifier enable control signal and the sense amplifier disable control signal to output the sense amplifier control signal.

2. The semiconductor memory device according to claim 1, wherein the sensing time control unit comprises:
    a delay unit for delaying the sense amplifier enable control signal; and
    a switch for selectively transmitting the sense amplifier enable control signal and an output signal from the delay unit in response to the refresh signal.

3. The semiconductor memory device according to claim 2, wherein the switch transmits an output signal from the delay unit at a refresh mode if the refresh signal is enabled, and transmits the sense amplifier enable control signal at a normal mode if the refresh signal is disabled.

4. A semiconductor memory device for performing a refresh operation, comprising:
    a memory cell array comprising a plurality of cells for storing data;
    a driving control unit for receiving a row address and a plurality of command signals to output a word line control signal and a sense amplifier control signal, and for setting a longer sensing time enable period of the same sense amplifier control signal at a refresh mode than at a normal mode in response to a refresh signal so as to secure a sufficient delta voltage by increasing sensing time only at a refresh mode;
    a word line driving unit for receiving the word line control signal to drive a word line;
    a sense amplifier driving unit for receiving the sense amplifier control signal to drive a sense amplifier; and
    a sense amplifier for sensing and amplifying data of the bit line in response to an output signal from the sense amplifier driving unit,
    wherein the driving control unit comprises:
        a row active control unit for receiving a row active command signal of the plurality of command signals to output a row active control signal;
        a row precharge control unit for receiving a row precharge command signal of the plurality of command signals to output a row precharge control signal;
        a bit line separating control signal output unit for receiving the row active control signal and the row precharge control signal to output a bit line separating control signal for controlling when a bit line separating signal is enabled;
        a word line control signal output unit for receiving the row active control signal and the row precharge control signal to output a word line control signal for controlling when a word line is enabled; and
        a sense amplifier control signal output unit for receiving the row active control signal, the row precharge control signal and the refresh signal to output the sense amplifier control signal for controlling when a sense amplifier is enabled.

* * * * *